United States Patent
Liu

(10) Patent No.: US 6,731,504 B1
(45) Date of Patent: May 4, 2004

(54) HEAT SINK FASTENER

(76) Inventor: A-Sheng Liu, No. 16, Wu Lin St., Shu Lin City, Taipei Hsien (TW)

( * ) Notice: Subject to any disclaimer, the term of this patent is extended or adjusted under 35 U.S.C. 154(b) by 40 days.

(21) Appl. No.: 10/414,039

(22) Filed: Apr. 16, 2003

(30) Foreign Application Priority Data

Jan. 17, 2003 (TW) ..................................... 92200907 U

(51) Int. Cl.[7] .............................................. H05K 7/20
(52) U.S. Cl. ...................... 361/704; 361/709; 361/710; 257/718; 257/727; 174/16.3; 165/80.3; 24/505; 24/510; 24/457
(58) Field of Search .............................. 361/704, 707, 361/709, 710; 257/706, 118, 719, 722, 727; 174/16.3; 165/80.2, 80.3; 24/505, 510, 457, 295

(56) References Cited

U.S. PATENT DOCUMENTS 6,318,452 B1 * 11/2001 Lee ........................... 165/80.3
6,421,242 B1 * 7/2002 Chen .......................... 361/704
6,480,384 B2 * 11/2002 Lo .............................. 361/704
6,507,491 B1 * 1/2003 Chen .......................... 361/697
6,522,545 B2 * 2/2003 Shia et al. ................... 361/704
6,563,716 B1 * 5/2003 Truong et al. .............. 361/816

* cited by examiner

Primary Examiner—Boris Chèrvinsky
(74) Attorney, Agent, or Firm—Rosenberg, Klein & Lee

(57) ABSTRACT

A heat sink fastener for securing a heat sink to a CPU is described as having a holding down spring plate. The holding down spring plate has a flat bearing portion at one end, a first hook plate extended from one end of the holding down spring plate remote from the flat bearing portion, a second hook plate coupled to the flat bearing portion of the holding down spring plate, and a locking lever pivoted to the second hook plate in direction substantially perpendicular to the holding down spring plate and turnable relative to the second hook plate between a locked position and an unlocked position. The locking lever has a cam peripherally supported on the flat bearing portion of the holding down spring plate.

11 Claims, 6 Drawing Sheets

HEAT SINK FASTENER

BACKGROUND OF THE INVENTION

1. Field of the Invention

The present invention relates to a heat sink fastener adapted to hold down a heat sink on a CPU (Central Processing Unit) and, more particularly, to a simple structure of heat sink fastener, which can easily be installed without the use of any tools.

2. Description of the Related Art

A CPU (Central Processing Unit) is a computational and control unit of a computer that interprets and executes instructions. By means of definition, the CPU functions as the "brain" of a computer. Following fast development in computer technology, advanced CPUs are made having a relatively smaller size but relatively faster operation speed. During the operation of an advanced CPU, much heat is produced. In order to dissipate heat from the CPU of a computer, a heat sink or cooling means is used.

FIG. 1 illustrates a prior art heat sink fastener fastened to a motherboard 108 to hold down a heat sink 101 on a CPU 109 at the motherboard 108. This structure of heat sink fastener is comprised of an elongated spring plate 100, a connecting plate 107, and a screw 106. The elongated spring plate 100 is pressed on the top surface of the flat bottom panel of the heat sink 101, having one end terminating in a downwardly extended fixed end portion 102, which has a retaining hole 105 fastened to a first lateral side of a CPU holder 104 holding the CPU 109 on the motherboard 108, and the other end terminating in a free end portion 103, which is fastened to the connecting plate 107 by the screw 106. The connecting plate 107 is fixedly located on the motherboard 108 and separated from a second lateral side of the CPU holder 104 by a distance. This design for a heat sink fastener is complicated. Further, a special hand tool must be used when installing this heat sink fastener.

Therefore, it is desirable to provide a heat sink fastener that eliminates the aforesaid drawbacks.

SUMMARY OF THE INVENTION

The present invention has been accomplished under the circumstances in view. It is therefore the main object of the present invention to provide a heat sink fastener, which is easy and inexpensive to manufacture. It is another object of the present invention to provide a heat sink fastener, which is easy to install without the use of any tools. It is still another object of the present invention to provide a heat sink fastener, which occupies less installation space when installed. To achieve these and other objects of the present invention, the heat sink fastener comprises a holding down spring plate. The holding down spring plate has a first end and a second end. A flat bearing portion is formed on the first end. A first hook plate extends from the second end of the holding down spring plate remote from the flat bearing portion. A second hook plate is coupled to the first end of the holding down spring plate. A locking lever is pivoted to the second hook plate in direction substantially perpendicular to the holding down spring plate and turnable relative to the second hook plate between a locked position and an unlocked position. The locking lever has a cam peripherally supported on the flat bearing portion of the holding down spring plate.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENT

Figure 1:
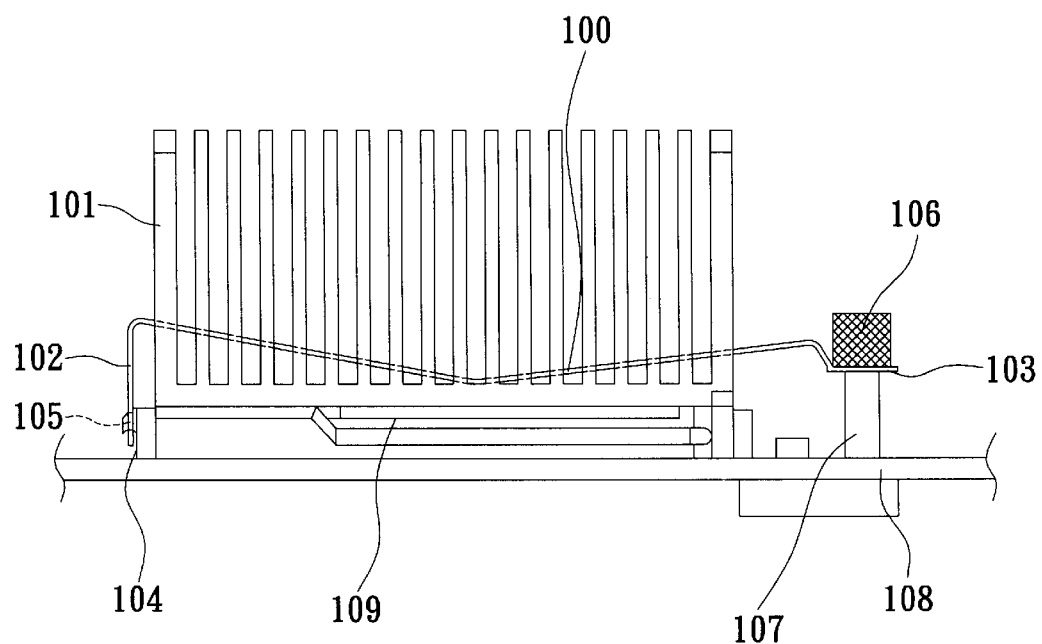
FIG. 1 is a schematic side view showing the installation of a heat sink fastener according to the prior art.
Figure 2:
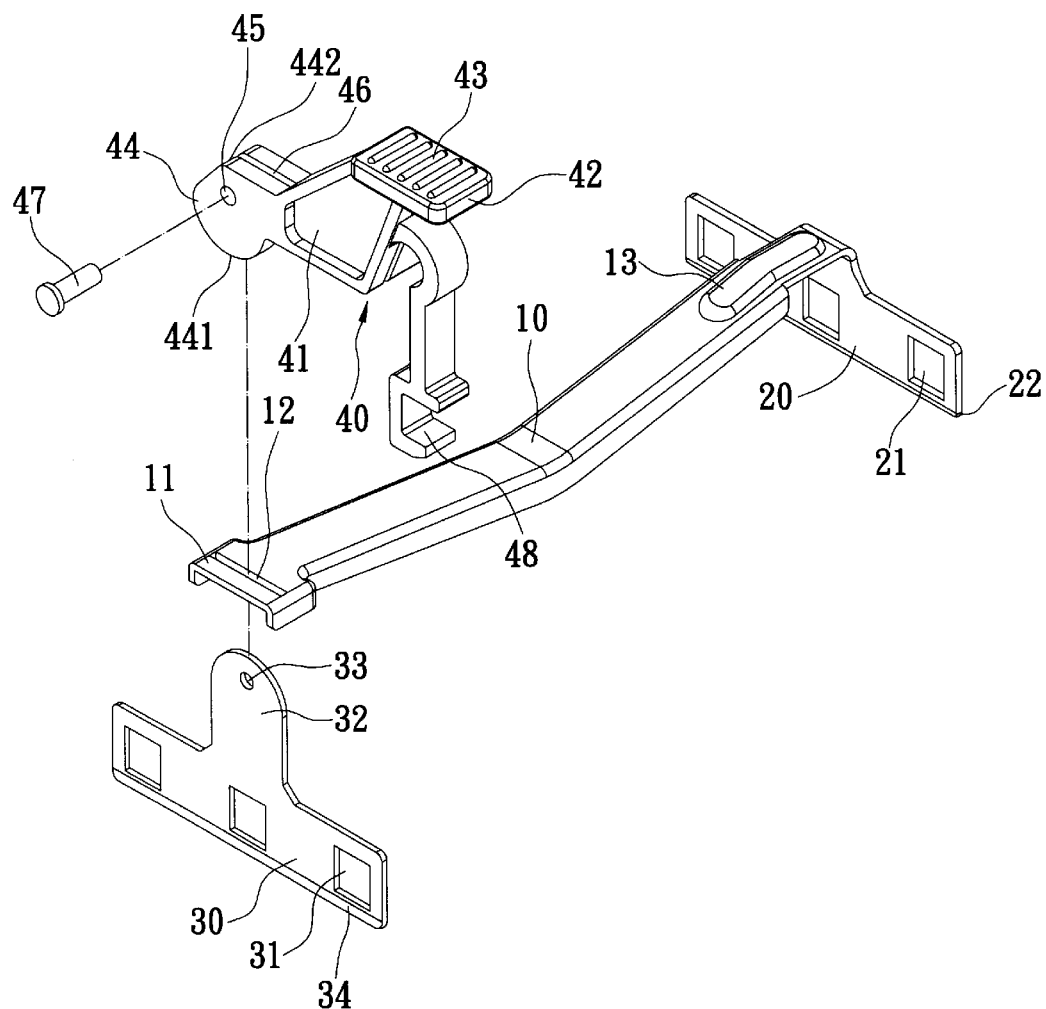
FIG. 2 is an exploded view of a heat sink fastener according to the present invention.
Figure 3:
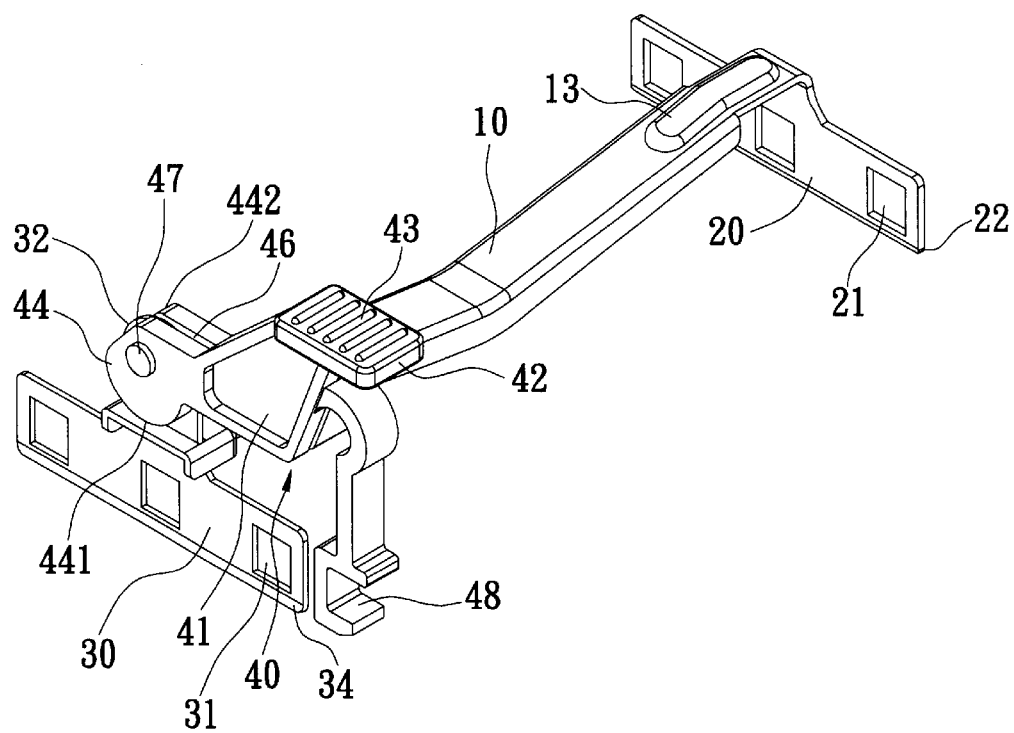
FIG. 3 is an assembly view of the heat sink fastener according to the present invention.

Referring to FIGS. 2 and 3, a heat sink fastener in accordance with the present invention is shown comprised of an elongated holding down spring plate 10, a first hook plate 20, a second hook plate 30, and a locking bar 40.

The holding down spring plate 10 is a substantially V-shaped resilient metal plate, having one end terminating in a flat bearing portion 11 and a slot 12 in the flat bearing portion. 11 through the top and bottom sides thereof.

The first hook plate 20 is an elongated metal plate member disposed perpendicular to the holding down spring plate, having a middle part of the top side thereof formed integral with one end of the holding down spring plate 10 remote from the flat bearing portion 11, a hooked portion 22 obliquely upwardly projected from the bottom side thereof toward the holding down spring plate 10, and a plurality of hook holes 21 horizontally spaced above the hooked portion 22. Further, a protruding reinforcing portion 13 is formed in the connection area between the holding down spring plate 10 and the first hook plate 20 by stamping to reinforce the structural strength of the holding down spring plate 10.

The second hook plate 30 is an elongated metal plate member corresponding to the first hook plate 20, comprising a hooked portion 34 obliquely upwardly projected from the bottom side thereof, a plurality of hook holes 31 horizontally spaced above the hooked portion 34, a top lug 32 upwardly extended from the middle part of the top side thereof, and a pivot hole 33 in the top lug 32. The top lug 32 is inserted through the slot 12 of the flat bearing portion 11 of the holding down spring plate 10 and pivoted to the locking lever 40.

The locking lever 40 is injection-molded from plastics and comprises a lever body 41, a finger strip 42 and a hook 48 extended from one end of the lever body 41, a cam 44 formed in the other end of the lever body 41, a pivot hole 45 axially extended through the cam 44, and a slot 46 radially extended through the cam 44 across the pivot hole 45. The cam 44 has an engagement portion 441 and a release portion 442 in the periphery. The finger strip 42 has anti-skid ribs 43 for positive positioning of the fingers. The hook 48 is curved downwards from one end of the lever body 41 below the finger strip 42. The distance between the pivot hole 45 and the engagement portion 441 is greater than the distance between the pivot hole 45 and the release portion 442.

During the assembly process of the heat sink fastener, the cam 44 of the locking lever 40 is supported on the flat bearing portion 11 of the holding down spring plate 10. The top lug 32 of the second hook plate 30 is then inserted through the slot 12 of the holding down spring plate 10 into the slot 46 of the locking lever 40 from the bottom side toward the top side. A pivot 47 is then fastened to the pivot hole 33 of the top lug 32 of the second hook plate 30 and the pivot hole 45 of the locking lever 40 to pivotally secure the locking lever 40 to the second hook plate 30 and the holding down spring plate 10. When assembled, the user can turn the locking lever 40 about the pivot 47 relative to the second hook plate 30 between a first position, namely, the locked position where the engagement portion 441 is maintained in close contact with the flat bearing portion 11, and a second position, namely, the unlocked position where the release portion 442 is maintained in close contact with the flat bearing portion 11.

Figure 4:
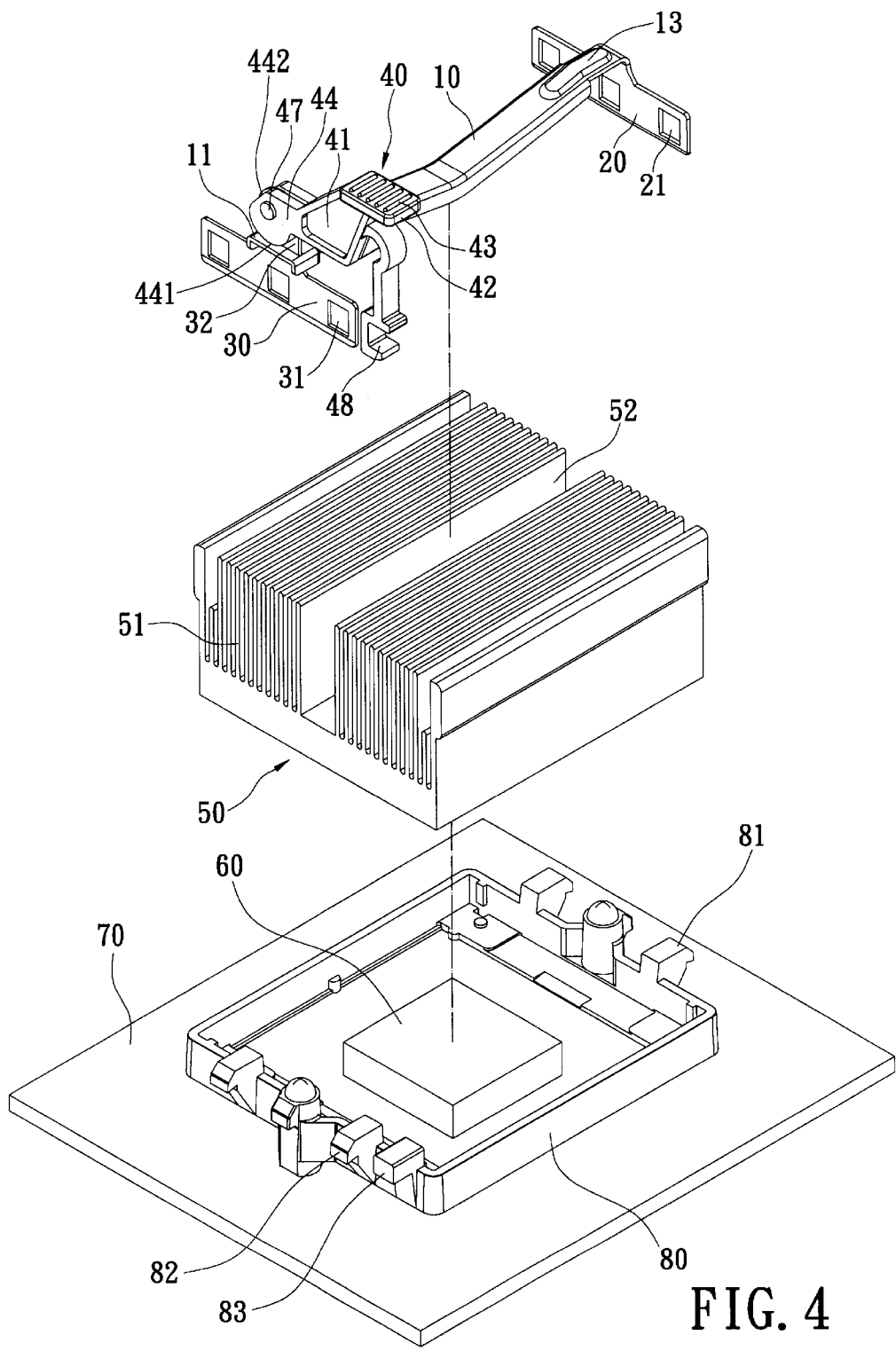
FIG. 4 is an exploded view of the heat sink fastener, a heat sink, and a CPU holder on a motherboard according to the present invention.
Figure 5:
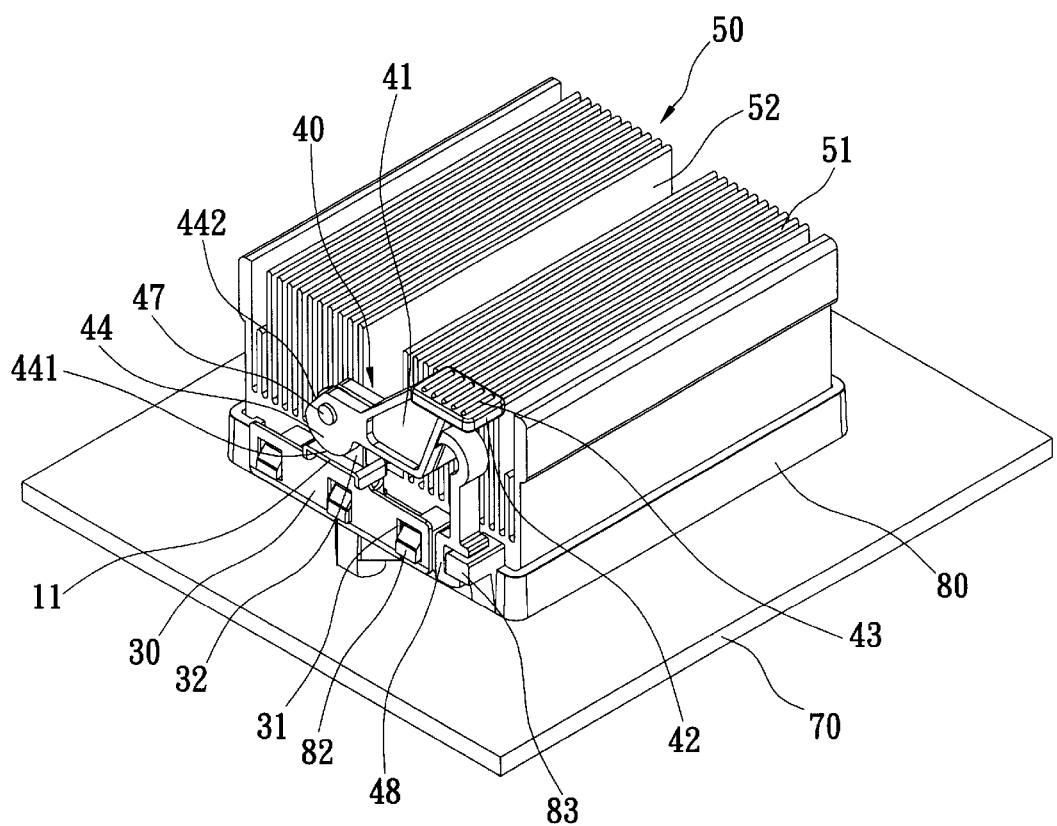
FIG. 5 is an assembly view of FIG. 5.
Figure 6:
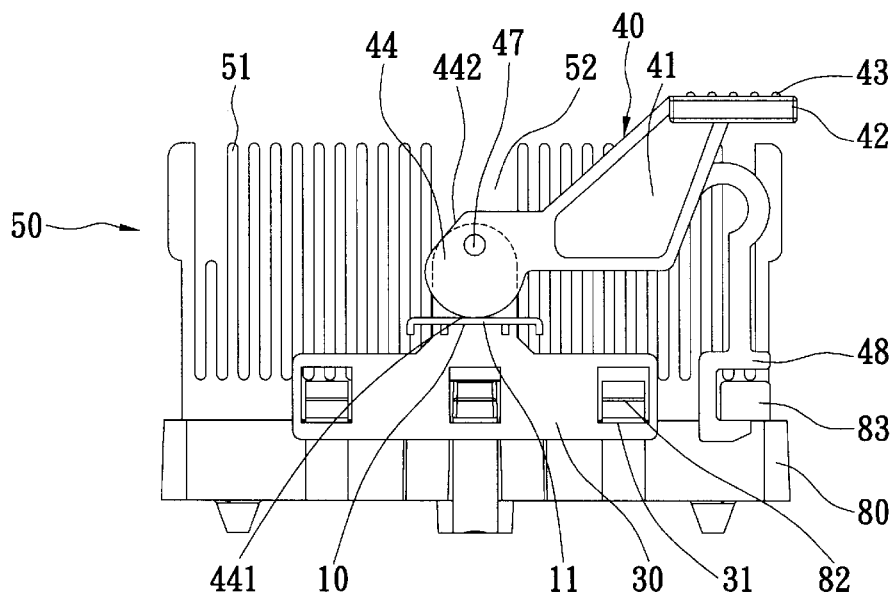
FIG. 6 is a side view of FIG. 5.

Referring to FIGS. 4–6, the aforesaid heat sink fastener is adapted to hold down a heat sink 50 on a CPU 60 in a CPU holder 80 at a motherboard 70. The heat sink 50 is made from aluminum, copper, or any of a variety of heat conductive metal materials by means of extruding, casting or bending. The heat sink 50 has upright radiation fins 51 for dissipation of heat, and a locating groove 52 on the middle adapted to accommodate the holding down spring plate 10. The heat sink 50 is mounted in the CPU holder 80, and maintained in close contact with the top surface of the CPU 60 to receive heat from the CPU 60. The CPU holder 80 holds the CPU 60 on the motherboard 70. The CPU holder 80 has a plurality of hooks 81 and 82 symmetrically disposed at two sides corresponding to the hook holes 21 and 31 of the hook plates 20 and 30, and a retaining rod 83 disposed at one side corresponding to the hook 48 of the locking lever 40.

Figure 7:
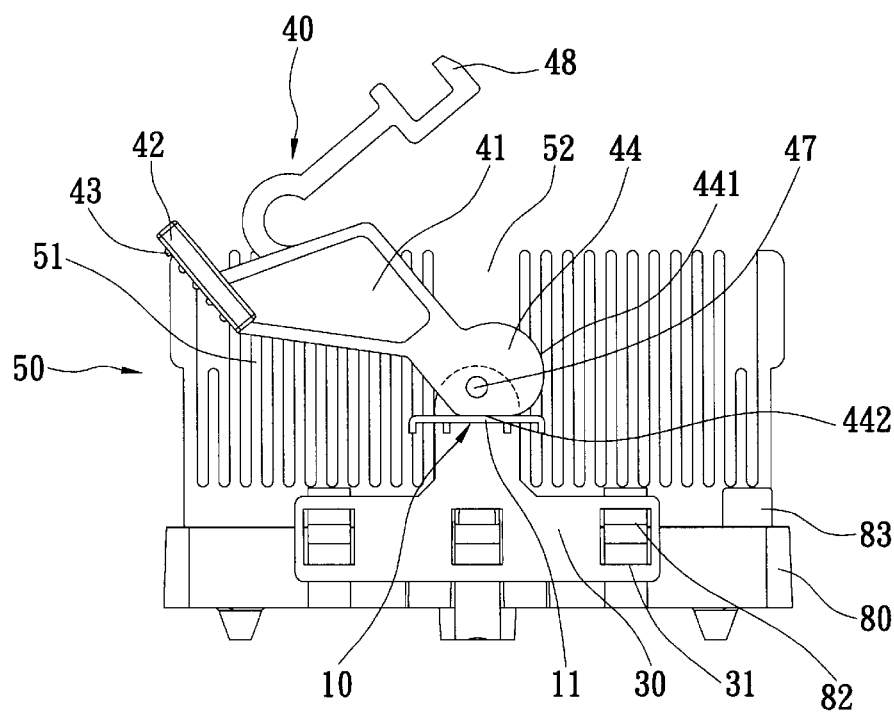
FIG. 7 is similar to FIG. 6 but shows the locking lever turned to the unlocked position.

During installation, the holding down spring plate 10 is put in the locating groove 52 of the heat sink 50 in the CPU holder 80 above the CPU 60. The hook holes 21 of the first hook plate 20 are then respectively hung on the hooks 81 at one side of the CPU holder 80. The hook holes 31 of the second hook 30 are subsequently respectively forced into engagement with the hooks 82 at the opposite side of the CPU holder 80, after which locking lever 40 is turned by hand from the unlocked position (see FIG. 7) to the locked position (see FIG. 6) to force the engagement portion 441 of the cam 44 into close contact with the flat bearing portion 11 of the holding down spring plate 10 and the hook 48 into engagement with the retaining rod 83. When installed, the hooked portions 21 and 34 of the hook plates 20 and 30 are respectively stopped below the hooks 81 and 82 of the CPU holder 80. When set in the locked position, the holding down spring plate 10 imparts a downward pressure to the heat sink 50 against the CPU 60, keeping the bottom surface of the heat sink 50 in close contact with the top surface of the CPU 60.

When unlocking the heat sink fastener, hook 48 of the locking lever 40 is forced away from the retaining rod 83 of the CPU holder 80. The finger strip 42 of the locking lever 40 is then turned with the fingers to move the engagement portion 441 of the cam 44 away from the flat bearing portion It of the holding down spring plate 10 and to force the release portion 442 into contact with the flat bearing portion 11 of the holding down spring plate 10. At this time, the hook holes 31 of the second hook plate 30 are disengaged from the constraint of the corresponding hooks 82, and the user can then easily remove the heat sink fastener from the CPU holder 80 and the heat sink 50.

Further, when the heat sink fastener is installed in the heat sink 50 and the CPU holder 80 and locked, the locking lever 40 is closely attached to one vertical peripheral side of the heat sink 50. Therefore, the installation of the heat sink fastener does not occupy much motherboard space.

A prototype of heat sink fastener has been constructed with the features of the annexed drawings of FIGS. 2–7. The heat sink fastener functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A heat sink fastener comprising:
    a holding down spring plate, said holding down spring plate having a first end, a second end, and a flat bearing portion formed on said first end;
    a first hook plate extended from the second end of said holding down spring plate;
    a second hook plate coupled to the first end of said holding down spring plate; and
    a locking lever pivoted to said second hook plate in a direction substantially perpendicular to said holding down spring plate and turnable relative to said second hook plate between a locked position and an unlocked position, said locking lever having a cam peripherally supported on said flat bearing portion of said holding down spring plate.

2. The heat sink fastener as claimed in claim 1, wherein said holding down spring plate is a substantially V-shaped elongated spring plate.

3. The heat sink fastener as claimed in claim 1, wherein said holding down spring plate has a protruding reinforcing portion formed in a part thereof and connected to said first hook plate.

4. The heat sink fastener as claimed in claim 1, wherein said holding down spring plate has a slot in said flat bearing portion, said cam of said locking lever has an axially extended pivot hole and a slot radially extended across the pivot hole, and said second hook plate has a top lug inserted from a bottom side of said holding down spring plate through the slot of said holding down spring plate into the slot of said cam of said locking lever and a pivot hole pivotally fastened to the pivot hole of said cam of said locking lever by a pivot.

5. The heat sink fastener as claimed in claim 1, wherein said first hook plate is formed integral with the second end of said holding down spring plate.

6. The heat sink fastener as claimed in claim 1, wherein said first hook plate has a hooked portion obliquely upwardly projecting from a bottom side thereof toward said holding down spring plate for mounting.

7. The heat sink fastener as claimed in claim 1, wherein said first hook plate has a plurality of hook holes for mounting.

8. The heat sink fastener as claimed in claim 1, wherein said second hook plate has a plurality of hook holes for mounting.

9. The heat sink fastener as claimed in claim 1, wherein said second hook plate has a hooked portion obliquely upwardly projecting from a bottom side thereof toward said holding down spring plate for mounting.

10. The heat sink fastener as claimed in claim 1, wherein said locking lever comprises a lever body extended from the periphery of said cam and a finger strip extended from one end of said lever body remote from said cam, and said cam of said locking lever has an engagement portion and a release portion respectively formed in the periphery thereof, said engagement portion being moved into contact with said flat bearing portion of said holding down spring plate when said locking lever turned from said unlocked position to said locked position, said release portion being moved into contact with said flat bearing portion of said holding down spring plate when said locking lever turned from said locked position to said unlocked position.

11. The heat sink fastener as claimed in claim 1, wherein said locking lever has a hook curved downwards from one end thereof remote from the first end of said holding down spring plate for positioning.

* * * * *